United States Patent [19]

Schouhamer Immink

[11] Patent Number: 4,750,138

[45] Date of Patent: Jun. 7, 1988

[54] METHOD OF TRANSMITTING INFORMATION, ENCODING DEVICE FOR USE IN THE METHOD, AND DECODING DEVICE FOR USE IN THE METHOD

[75] Inventor: Kornelis A. Schouhamer Immink, Eindhoven, Netherlands

[73] Assignee: U.S. Philips Corporation, New York, N.Y.

[21] Appl. No.: 710,659

[22] Filed: Mar. 11, 1985

[30] Foreign Application Priority Data

Oct. 10, 1984 [NL] Netherlands ............... 8403078

[51] Int. Cl.$^4$ .............................. H04L 25/49
[52] U.S. Cl. .............. 364/514; 340/347 DD; 375/19; 360/40
[58] Field of Search ............... 364/514; 340/347 DD; 375/19; 360/32, 39, 40

[56] References Cited

U.S. PATENT DOCUMENTS 4,348,659 9/1982 Fujimori et al. ............ 340/347 DD
4,573,034 2/1986 Immink .................. 340/347 DD
4,598,267 7/1986 Fukuda .................. 340/347 DD
4,620,311 10/1986 Immink ...................... 375/19

FOREIGN PATENT DOCUMENTS 1540617 2/1979 United Kingdom .

Primary Examiner—L. T. Hix
Assistant Examiner—David M. Gray
Attorney, Agent, or Firm—Thomas A. Briody; Jack E. Haken; Anne E. Barschall

[57] ABSTRACT

A method for converting m-bit information words into n-bit code words and vice versa. The code words have a limited disparity in order to obtain a d.c. free code. A reduction of the low-frequency content of the spectrum is obtained by selecting the code words in such a way that the sum $$\sum_{k=1}^{i} \sum_{j=1}^{k} x_j$$

remains restricted over all the previously generated bits $x_j$ of the preceding code words.

18 Claims, 5 Drawing Sheets

| n | M | R |
|---|---|---|
| 4 | 2 | 0.250 |
| 8 | 8 | 0.375 |
| 12 | 58 | 0.488 |
| 16 | 526 | 0.565 |
| 20 | 5448 | 0.621 |
| 24 | 61108 | 0.662 |
| 28 | 723354 | 0.695 |
| 32 | 8908546 | 0.722 |
| 36 | 113093022 | 0.743 |

FIG.4

| r = | 2 | 4 | 6 | 8 | 10 |
|---|---|---|---|---|---|
| n = 4 | .396 | .5 | – | – | – |
| 8 | .488 | .557 | .594 | .625 | .641 |
| 12 | .568 | .616 | .648 | .672 | .689 |
| 16 | .627 | .663 | .688 | .707 | .722 |
| 20 | .670 | .700 | .720 | .736 | .748 |

FIG.5

|  | $z_1(i) < 0$ | $z_1(n)$ | $z_1(i) > 0$ | $z_1(n)$ |
|---|---|---|---|---|
| 0 0 | 1 0 0 1 | 0 | 1 0 0 1 | 0 |
| 0 1 | 0 1 1 0 | 0 | 0 1 1 0 | 0 |
| 1 0 | 1 0 1 0 | +2 | 0 1 0 1 | -2 |
| 1 1 | 1 1 0 0 | +4 | 0 0 1 1 | -4 |

FIG.6

| | $Z_1(i)$ | | | $Z_1(n)$ | $Z_1(i+4)$ |
|---|---|---|---|---|---|
| $a_3\,a_2$ | $a_1\,a_0$ | | $b_5\,b_4\,b_3\,b_2$ | | $b_1\,b_0$ |
| 0 0 | 0 0 | (+3) | 1 0 0 1 | 0 | 0 0 (+3) |
| 0 0 | 0 1 | (+1) | 1 0 0 1 | 0 | 0 1 (+1) |
| 0 0 | 1 0 | (−1) | 1 0 0 1 | 0 | 1 0 (−1) |
| 0 0 | 1 1 | (−3) | 1 0 0 1 | 0 | 1 1 (−3) |
| 0 1 | 0 0 | (+3) | 0 1 1 0 | 0 | 0 0 (+3) |
| 0 1 | 0 1 | (+1) | 0 1 1 0 | 0 | 0 1 (+1) |
| 0 1 | 1 0 | (−1) | 0 1 1 0 | 0 | 1 0 (−1) |
| 0 1 | 1 1 | (−3) | 0 1 1 0 | 0 | 1 1 (−3) |
| 1 0 | 0 0 | (+3) | 0 1 0 1 | −2 | 0 1 (+1) |
| 1 0 | 0 1 | (+1) | 0 1 0 1 | −2 | 1 0 (−1) |
| 1 0 | 1 0 | (−1) | 1 0 1 0 | +2 | 0 1 (+1) |
| 1 0 | 1 1 | (−3) | 1 0 1 0 | +2 | 1 0 (−1) |
| 1 1 | 0 0 | (+3) | 0 0 1 1 | −4 | 1 0 (−1) |
| 1 1 | 0 1 | (+1) | 0 0 1 1 | −4 | 1 1 (−3) |
| 1 1 | 1 0 | (−1) | 1 1 0 0 | +4 | 0 0 (+3) |
| 1 1 | 1 1 | (−3) | 1 1 0 0 | +4 | 0 1 (+1) |

FIG. 7

METHOD OF TRANSMITTING INFORMATION, ENCODING DEVICE FOR USE IN THE METHOD, AND DECODING DEVICE FOR USE IN THE METHOD

BACKGROUND OF THE INVENTION

1. Field of the Invention

The invention relates to a method of transmitting information. Prior to transmission, m-bit information words are converted into n-bit code words. After transmission said n-bits code words are re-converted into m-bit information words. In the words, m<n and m and n are positive integers. In order to obtain a d.c. free transmission the possible code words have been selected in such a way that the running sum $$\sum_{j=1}^{i} x_j$$

remains restricted over the bits of the generated code words, where $x_j = \pm 1$ is the value of the $j^{th}$ bit, regardless of the sequence of information words.

The invention also relates to an encoding device for use in the method.

Moreover, the invention relates to a decoding device for use in the method.

2. Prior Art

Such methods and devices are employed in order to obtain an optimal signal spectrum for transmission. For example, in the case of transmission via a magnetic tape, and also via other media such as cables, the ether, or optical record carriers, it is desirable to have a d.c. free signal and a spectrum with a minimal low-frequency content in order to make room for various control signals such as tracking signals in recording. It is known, inter alia from GB-PS No. 1,540,617 that a d.c. free code is obtained if the running sum over consecutively generated bits remains restricted. This happens when logic "1" and logic "0" are assigned opposite values). Restricted means that there will be no series of input words which gives rise to a series of code word whose running sum increases towards infinity. The simplest method of guaranteeing this is to use as code words only those words which have a disparity equal to zero. Disparity is the sum over the bit value of the code word, i.e. the variation of the running sum caused by this code word. To use code words having zero disparity means to use only code words comprising as many ones as zeros. An example of this is the "biphase" code in accordance with the table in FIG. 2. Another simple method, which results in a larger number of possible code words and which is therefore more efficient, is described in said British Patent Specification. In addition to code words of zero disparity, code words of a specific non-zero disparity are permissible. Both a code word of positive disparity and a code word of opposite disparity (for example +2 and −2) may be assigned to the relevant input words. One of these two code words is chosen according to the digital sum value (running sum) over the preceding code words, i.e. so that the absolute value of this digital sum value remains restricted. The simplest way to do this has been to select a first set of code words and to generate the associated set of code words by inverting the words of the first set.

SUMMARY OF THE INVENTION

The invention aims at providing a method, encoding device, and decoding device of the kind set forth in the opening paragraph, and in which the spectrum of the code words generated from random information words has a smaller low-frequency signal content than prior methods and devices.

The method in accordance with the invention is characterized in that the possible code words are selected in such a way that an additional running sum $$\sum_{k=1}^{i} \sum_{j=1}^{k} x_j$$

remains restricted. This additional running sum is over all the preceding sum values over the bits of the generated code words.

The invention is based on a recognition of the fact that by limiting the sum $$\sum_{k=1}^{i} \sum_{j=1}^{k} x_j$$

the second derivative $S''(\omega)$ of the energy spectrum $S(\omega)$ is zero for $\omega=0$, which means a reduction of the low-frequency content of the spectrum.

In a further embodiment, the method in accordance with the invention is characterized in that: to a first group of information words, code words are assigned which comply with $$\sum_{k=1}^{n} \sum_{j=1}^{k} x_j = 0$$

for every n-bit code word; to a first group of information words, first and second code words are assigned for which the sum $$\sum_{k=1}^{n} \sum_{j=1}^{k} x_j$$

has a value +a and −b, respectively; and, when an information word of said first group appears, a choice is made from the two possible code words as a function of the running sum $$\sum_{k=1}^{i} \sum_{j=1}^{k} x_j$$

over all the preceding code words, in such a way that said running sum is minimized.

In yet another embodiment, the encoding device in accordance with the invention is characterized in that the parameters a and b are equal.

In a still further embodiment, the decoding device in accordance with the invention is characterized by a conversion circuit for converting the m-bit information words into n-bit code words in such a way that the running sum $$\sum_{k=1}^{i} \sum_{j=1}^{k} x_j$$

over all the preceding sum values over the bits of the generated code words remains restricted.

BRIEF DESCRIPTION OF THE PREFERRED

The invention will now be described in more detail, by way of example, with reference to the accompanying drawings, in which.

Figures 1, 2, 3:
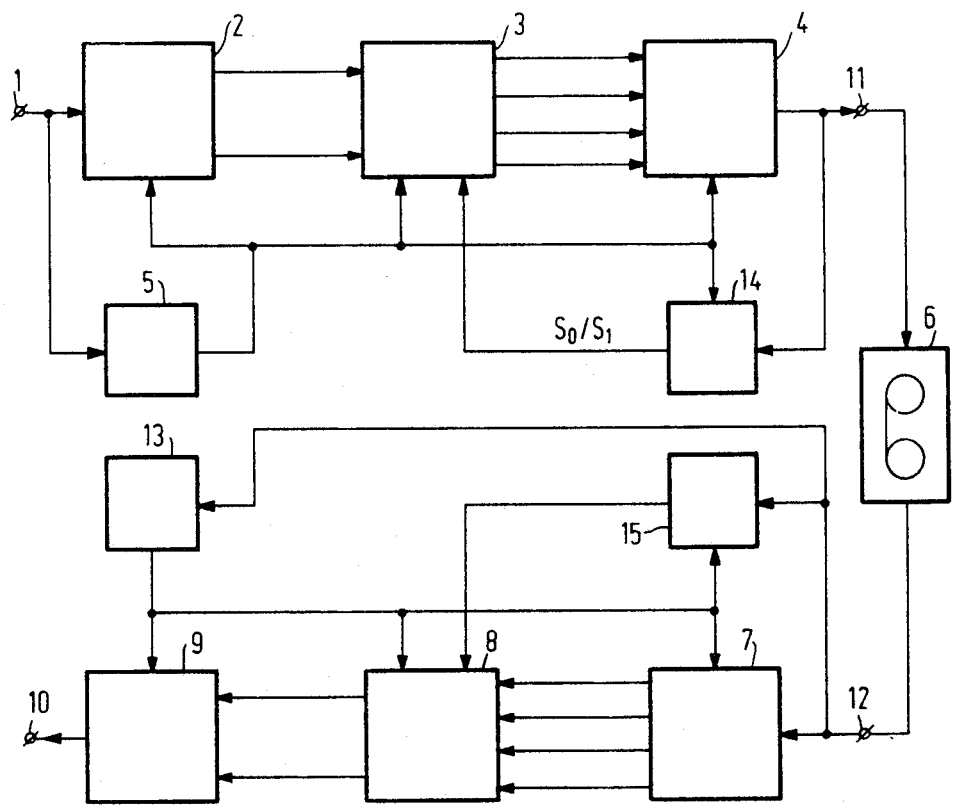
FIG. 1 shows a known device using a method of transmitting information.
FIG. 2 shows a conversion table used in a known encoding/decoding method.
Figure 8:
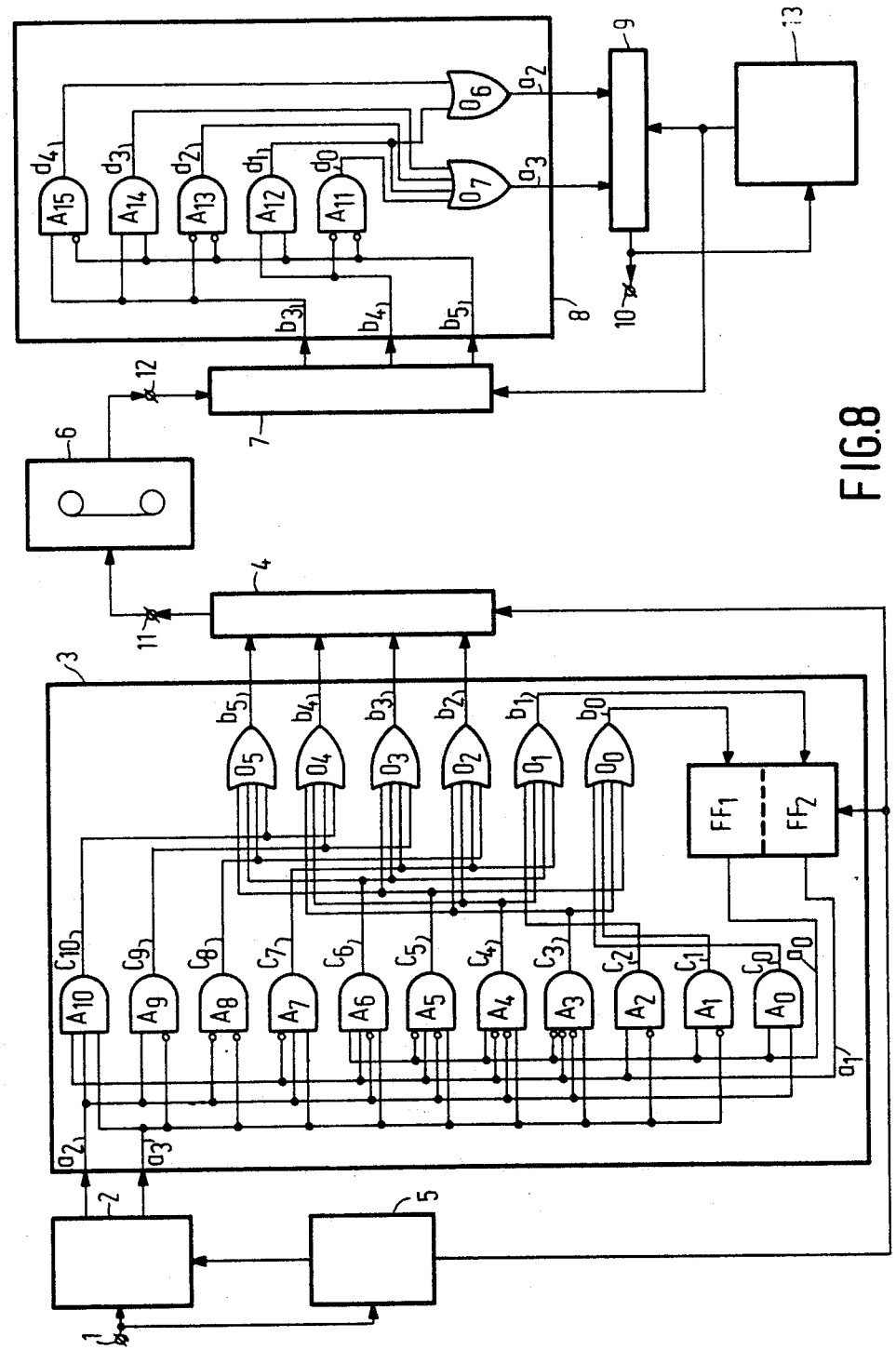
Figure 9:
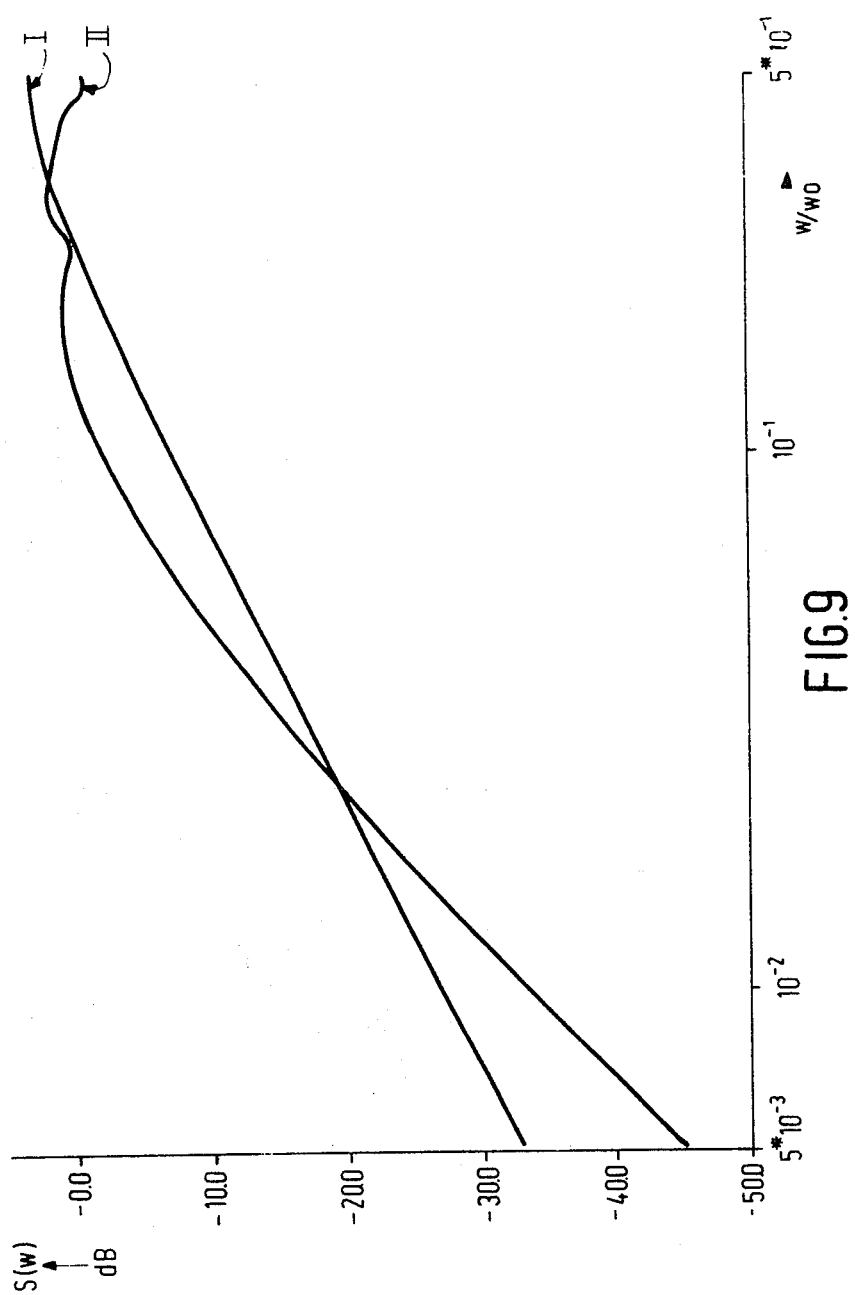

FIG. 3 shows a table for an encoding/decoding method in accordance with the invention, FIG. 4 shows a table to illustrate the efficiency R of a group of encoding/decoding methods in accordance with the invention, FIG. 5 is a table illustrating the efficiency of another group of encoding/decoding methods in accordance with the invention, FIG. 6 is a table relating to a preferred version of an encoding/decoding method in accordance with the invention, FIG. 7 is a table to explain the use of the code in accordance with the table of FIG. 6, FIG. 8 shows a device using the preferred version of the method in accordance with the invention, and FIG. 9 is a graph illustrating the effect of the invention and showing the energy spectrum obtained when the codes of the tables of FIGS. 2 and 6 are used.

DETAILED DESCRIPTION OF THE PREFERRED EMBODIMENT

FIG. 1 shows a device employing a system of encoding and decoding digital data. The device comprises an input 1 for receiving serial input data and (unless the data is presented in parallel form) applying said data to a series-to-parallel converter 2 for arranging the input data in 2-bit parallel words in the present example. These 2-bit words are applied to an encoding circuit 3, for example in the form of a look-up table or a gate circuit, which encoding circuit in the present example, generates a 4-bit output word for every input word in conformity with the rules laid down by means of this encoding circuit. By means of a parallel-to-series converter 4 these 4-bit words are converted into a serial data sequence, which is, for example, recorded on a magnetic tape by means of a conventional analog magnetic-tape recorder 6. It is then possible to record, for example, a plurality of parallel tracks. Synchronisation is effected by means of clock signals which are derived from the input signal by a clock signal generator circuit 5, for example by means of a phase-locked loop.

In principle, decoding may be effected by means of a similar circuit arrangement through which the signals are fed in reverse sequence. The signal from the tape recorder 6 is arranged in groups of 4-bit words by a series-to-parallel converter 7 (unless the data is available as 4-bit words). These 4-bit words are converted into 2-bit words with a decoder circuit 8 in conformity with rules which are complementary to those used for encoding and are subsequently converted into a serial data stream on output 10 by means of a parallel-to-series converter 9. Again, this process is synchronised with clock signals which are derived, by means of the clock-signal generator circuit 13, from the signal which is obtained from the recorder 6 and which appears on input 12 of the series-to-parallel converter 7.

Conversion in the encoding circuit 3 is effected inter alia in order to obtain a signal spectrum which is suitable for transmission. For example, in the case of transmission via a magnetic tape, but also in the case of transmission via other media such as cables, the ether or optical record carriers, it is desirable to have a d.c. free signal and a spectrum with a minimal low-frequency content to enable various control signals, such as tracking signals in the case of recording, to be accommodated. For example from GB-PS No. 1,540,617 it is known that a d.c. free code is obtained when the running sum over the consecutively generated bits is limited (a value opposite to the value of a logic "1" being assigned to a logic "0"), which means that there is no series of input words which give rise to a series of code words whose running sum grows towards infinity. The simplest method of guaranteeing this is to use for the code words only those words whose disparity (which is the sum over the bit value of the code word, i.e. the variation of the running sum caused by this code word) is zero, so only code words comprising as many ones as zeros. An example of this is the "Biphase" code given in the form of a table in FIG. 2. Another simple method which allows more possible code words and is therefore more efficient, is described in said British Patent Specification. Apart from code words with zero disparity, code words with a specific non-zero disparity are also permissible, both a code word of positive disparity and a code word of opposite disparity being assigned to a code word (for example +2 and −2) and a choice being made from these two words depending on the digital sum value (running sum) over the preceding code words, in such a way that the absolute value of this digital sum value remains restricted. The simplest way is to select one set and to generate the associated words of the other set by inverting the words of the first-mentioned set.

In the device shown in FIG. 1 this can be achieved by determining the digital sum value over all the preceding words with an up/down counter 14 which counts down upon receipt of every logic zero and which counts up upon receipt of every logic one and by generating as a function thereof a logic signal $S_o/S_1$ which indicates whether this digital sum value has a high ($S_1$) or a low ($S_o$) value of two possible values. If the value of $S_o$ is low, the next input word is converted into a word of zero or +2 disparity in conformity with the applicable rules, so that the digital sum value remains $S_o$ or becomes $S_1$ ($S_1=S_o+2$) and, if the value of $S_1$ is high, this input word is converted into a word of zero or −2 disparity, so that the digital sum value remains $S_1$ or becomes $S_o$ ($S_o=S_1-2$).

During encoding, the digital sum value of all the preceding words is determined by means of the up/down counter 15 in order to determine as a function thereof whether during encoding a word of 0 or +2 disparity or a word of 0 or −2 disparity has been selected as the next code word. The decoding circuit 8 is controlled as a function of this. Both the encoding and the decoding circuit therefore comprise a set of code words $S_o$, obtained by means of rules or tables, which is valid if the digital sum value of all the preceding code words is $S_o$ and a set $S_1$ which is valid if the digital sum value of all the preceding words is $S_1$.

In accordance with the afore-mentioned Patent Specification one set $S_1$ can be derived simply from the other set $S_O$ when the words of zero disparity in both sets are selected to be identical and the words of −2 disparity are selected to be complementary to the words of +2 disparity. Applicant's U.S. Pat. No. 4,620,311 describes an improvement to this method.

Mathematically, the above may be defined as follows:

$$S(\omega = 0) = 0 \text{ if } Z_0(i) = \sum_{j=1}^{i} x_j \quad (1)$$

remains limited as i increases, where $S(\omega)$ is the energy spectrum, $Z_0(i)$ is the sum over all i preceding bits $x_j$, with $x_j = \epsilon\{+1, -1\}$, j the sequence number of the bits $x_j$, and $\omega$ the angular frequency. In the simplest case this requirement is therefore met if:

$$Z_0(n) = \sum_{j=1}^{n} x_j = 0 \quad (2)$$

for each code word, i.e. for each (n-bit) code word the disparity is zero.

Further, in accordance with the invention:

$$S''(\omega = 0) = 0 \text{ if } z_1(i) = \sum_{k=1}^{i} z_0(k) = \sum_{k=1}^{i} \sum_{j=1}^{k} x_j \quad (3)$$

remains limited as i increases, which means that the second derivative $S''(\omega)$ of the energy spectrum $S(\omega)$ (the odd derivatives of $S(\omega)$ are always zero for $\omega=0$) are zero for $\omega=0$ when the sum $z_1(i)$ over all i preceding sums of k bits is restricted. In practice, the second derivative $S''(\omega)$ being zero means that the low-frequency content of the specturm is even smaller than in the case in which only $S(\omega=0)$ is zero, which may improve the usefulness of the code.

A further reduction of the low-frequency content can be obtained if:

$$z_2(i) = \sum_{k=1}^{i} z_1(k) = \sum_{k=1}^{i} \sum_{l=1}^{k} z_0(1) = \sum_{k=1}^{i} \sum_{l=1}^{k} \sum_{j=1}^{l} x_j \quad (4)$$

remains restricted as i increases.

Similarly, this requirement may be imposed on $Z_3(i)$, $Z_4(i)$, $Z_5(i) \ldots Z_p(i) \ldots$, a summation every time. In general, it may be stated that $$S^{2p}(\omega = 0) = 0 \text{ if } z_p(i) = \sum_{k=1}^{i} z_{p-1}(k) \quad (5)$$

remains restricted, where $S^{2p}(\omega)$ is the $2p^{th}$ derivative of the energy spectrum $S(\omega)$, $z_p(i)$ is the $p^{th}$ order sum, and $z_{p-1}$ is the $(p-1)^{th}$ order sum. In practice, these further requirements and the requirement for $z_2$ generally do not lead to efficient codes, so that only requirement (3) will be of practical significance.

Requirement (3), like requirement (1), can be met by imposing this requirement on every code word; this means that only those code words should be selected which for every n-bit code word comply with:

$$z_1(n) = \sum_{k=1}^{n} \sum_{j=1}^{k} x_j = 0 \quad (6)$$

This requirement is met if each code word complies with:

$$\sum_{j=1}^{n} jx_j = 0 \quad (7)$$

This requirement means that for each code word the sum over the product of the bit value and the sequence number of this bit for every word is zero. An example of a group of (2) code words which complies with requirement (6) is given in the table of FIG. 3, which gives the two possible 4-bit code words which meet requirement (6) and the associated 1-bit input words. The efficiency of such a conversion is 0.25 because the ratio between the input bit rate and the output bit rate is 0.25.

Similarly, the simplest way of meeting requirement (5) is to impose this requirement on every word. In general, this is met if every code word complies with:

$$\sum_{j=1}^{n} j^p x_j = 0 \quad (7)$$

where p is the order of the summation $z_p(i)$.

Another method of simply meeting requirement (3) is to select for each input word two code words for which the parameters $z_1(n)$ have non-zero values, as the case may be, together with code words whose parameters $z_1(n)$ are zero, and to select one of the two code words as a function of the logic sum $z_1(i)$ over all i/n preceding n-bit words, in such a way that this running sum $z_1(i)$ remains restricted. In addition, to meet requirement (1) that the running sum $z_0(i)$ (=digital sum value) remains restricted, any appropriate method may be adopted. A suitable choice is the choice for code words of non-zero disparity $(z_0(n)=0)$. If in addition those code words are selected whose sum $z_1(n)$ is also zero, the table in FIG. 4 gives the number M of possible code words which can be formed with n-bit words and the attainable efficiency $R = \log_2 (M)/n$. It is evident that for a more or less acceptable efficiency (for example $R \geq 0.5$) comparatively long code words of 16 or more bits have to be selected (all the code words should have a length equal to a multiple of 4 bits to meet the requirement that both $z_0(n)$ and $z_1(n)$ should be zero).

More efficient codes appear to be possible by maintaining the requirement $z_0(n)=0$ and admitting more values of $z_1(n)$. The table of FIG. 5 shows the code efficiency R, in which the first column gives the number of bits n of the code words and above each column the number of possible values r is given which the parameter $z_1(i)$ may assume at the end of each code word.

The table in FIG. 6 gives an example of a code where n=4 and r=4 (FIG. 5), which code is equivalent to the said biphase code (FIG. 2) as regards the efficiency R and the length of the code words. The first column of the table shows the 2-bit input word, the second column gives the associated 4-bit output word when the parameter $z_1(i)$ over all the preceding words is smaller than zero, the third column gives the value of $z_1(n)$ of this word, the fourth column gives the output word when the parameter $z_1(i)$ over all the preceding words is greater than zero, and the fifth column gives the value of $z_1(n)$ over this word. At the end of every word $z_1(i)$ then always has the four possible values +3, +1, −1 and −3.

FIG. 7 shows the table of FIG. 6 in more detailed form in order to translate the encoding rules into an encoding gate circuit.

In this example the parameter $z_1(n)$ may have values of +4 and −4, respectively, +2 and −2, respectively, and zero. The first column gives the 2-bit input word. The second column gives the value of the running sum $z_1(i)$ over all the preceding words in 2-bit notation and decimal notation, the third column gives the output code word to be selected, the fourth column the value of the sum $z_1(n)$ of this code word, and the fifth column gives the new value of the running sum $z_1(i+n)$ in two-bit notation and decimal notation.

As is shown in the table, the input words 00 and 01 are converted into the words 1001 and 0110, respectively, regardless of the running sum $z_1(i)$, which words each exhibit a sum $z_1(n)$ equal to zero, so that $z_1(i+n)$ remains equal to $z_1(i)$. The input word 10 is converted into an output word 0101 with $z_1(n) = -2$ when the sum $z_1(i)$ was equal to 00 or 01 (+3 and +1, respectively) and into an output word 1010 with $z_1(n) = -2$ when the sum $z_1(i)$ was 10 or 11 (−1 and −3, respectively). Similarly, the input word 11 is converted into an output word 0011 with $z_1(n) = -4$ when the sum $z_1(i)$ was 00 or 01 and into an output word 1100 with $z_1(n) = +4$ when this sum $z_1(i)$ was 10 or 11.

The code of FIG. 7 can be decoded without determining the parameter $z_1(i)$, because all the code words can be re-converted unambiguously into the original data words. This is even possible with only 3 of the 4 bits. This is because the code words have been selected with the requirement that $z_0(n) = 0$, i.e. code words comprising as many ones as zeros. Therefore, the information is defined by 3 of the 4 bits; the fourth bit merely ensures that $z_0(n) = 0$.

FIG. 8 shows an example of encoding and decoding in conformity with the table of FIG. 7. The device corresponds to that of FIG. 1 except for the sections 14 and 15 which are not necessary because there are only code words with $z_0(n) = 0$. In the encoding device 3 the input bits $a_2$ and $a_3$ and the parameter $z_1(i)$ representing bits $a_0$ and $a_1$ are converted into output bits $b_2$, $b_3$, $b_4$ and $b_5$ and the parameter $z_i(i+4)$ representing the bits $b_0$ and $b_1$ in conformity with the indication in the second row of the table in FIG. 7.

The bits $a_3$, $a_2$, $a_1$ and $a_0$ are applied to inverting and non-inverting inputs of AND-gates $A_0$ to $A_{10}$ in which they are combined in such a way that at the outputs of these AND-gates $A_0$ to $A_{10}$ the bits $c_0$ to $c_{10}$ appear in conformity with the following logic equations:

$$c_0 = a_0 \cdot a_2$$

$$c_1 = a_0 \cdot \overline{a_3}$$

$$c_2 = a_1 \cdot \overline{a_3}$$

$$c_3 = \overline{a_0} \cdot \overline{a_1} \cdot \overline{a_2} \cdot a_3$$

$$c_4 = a_0 \cdot \overline{a_1} \cdot \overline{a_2} \cdot a_3$$

$$c_5 = \overline{a_0} \cdot a_1 \cdot \overline{a_2} \cdot a_3$$

$$c_6 = a_0 \cdot a_1 \cdot \overline{a_2} \cdot a_3$$

$$c_7 = \overline{a_1} \cdot a_2 \cdot a_3$$

$$c_8 = \overline{a_2} \cdot \overline{a_3}$$

$$c_9 = a_2 \cdot \overline{a_3}$$

$$c_{10} = a_1 \cdot a_2 \cdot a_3$$

These bits $c_0$ to $c_{10}$ are subsequently combined to give bits $b_0$ to $b_5$ by OR-gates $0_0$ to $0_5$ in accordance with the following logic equations:

$$b_0 = c_0 + c_1 + c_3 + c_5$$

$$b_1 = c_2 + c_4 + c_6 + c_7$$

$$b_2 = c_3 + c_4 + c_7 + c_8$$

$$b_3 = c_5 + c_6 + c_7 + c_9$$

$$b_4 = c_3 + c_4 + c_9 + c_{10}$$

$$b_5 = c_5 + c_6 + c_8 + c_{10}$$

The bits $b_0$ and $b_1$ represent the new value of the parameter $z_1 = z_1(i+4)$ and are applied to the flip-flops $FF_1$ and $FF_2$ where they are latched until the next input word $a_2$, $a_3$ is converted.

In the decoding circuit 8 the bits $b_3$, $b_4$ and $b_5$ are combined to form bits $d_0$ to $d_4$ in AND-gates $A_{11}$ to $A_{15}$ in accordance with the following logic equations:

$$d_0 = \overline{b_5} \cdot \overline{b_4}$$

$$d_1 = b_5 \cdot b_4$$

$$d_2 = \overline{b_5} \cdot \overline{b_3}$$

$$d_3 = b_5 \cdot b_3$$

$$d_4 = \overline{b_5} \cdot b_3$$

By means of OR-gates $0_6$ and $0_7$ these bits $d_0$ to $d_4$ are combined to form the output bits $a_3$ and $a_2$ in conformity with the logic equation $$a_3 = d_0 + d_1 + d_2 + d_3$$

$$a_2 = d_1 + d_4$$

To illustrate the effect of the encoding method in accordance with the invention FIG. 9 shows the energy spectrum $S(\omega)$ in dB as a function of the relative angular frequency $\omega/\omega_o$ ($\omega_o$ is the channel bit frequency, which spectrum is symmetrical about $\omega/\omega_o = 0.5$) on a logarithmic scale. Curve I represents the spectrum when the biphase code of FIG. 2 is used and curve II gives the spectrum when the code of FIG. 7 is used. It can be seen that for low frequencies the code in accordance with the invention produces a smaller signal, as was required.

What is claimed is:
1. A method of encoding an information signal to be transmitted, comprising the steps of:
   a. receiving the information signal which comprises m-bit information words where m is a positive integer;
   b. converting m-bit information words into a n-bit code words prior to transmission, which includes selecting said n-bit code words so that a first running sum,

$$\sum_{j=1}^{i} x_j,$$

remains restricted over the bits of the n-bit code words regardless of the sequence of information words, $x_j$ being a value of a $J^{th}$ bit and $x_j$ having a first value for a logic one and a second value opposite to said first value for a logic zero, where n is a positive integer greater than m;

c. providing the n-bit code words to a transmitter; wherein the improvement comprises:

d. selecting said n-bit code words so that a second running sum, $$\sum_{k=1}^{i}\sum_{j=1}^{k} x_j,$$

remains restricted over the preceding sums over the bits of the n-bit code words, whereby the low frequency content of the encoded information signal is reduced.

2. The method of claim 1 comprising reconverting said n-bit code words into said m-bit information words after transmission.

3. The method of claim 1 comprising first selecting, for a first group of information words, code words so that $$\sum_{k=1}^{n}\sum_{j=1}^{k} x_j = 0$$

for every n-bit code word.

4. The method of claim 3 comprising:
(i) second selecting, for a second group of information words, first and second code words so that the sum, $$\sum_{k=1}^{n}\sum_{j=1}^{k} x_j,$$

has a value $+a$ and $-b$, respectively, over each said first and second code word;
(ii) choosing one of the two possible code words for each information word of said second group, so that the absolute value of said second running sum is minimized.

5. The method of claim 1 comprising:
(i) selecting, for each of a group of information words, first and second code words so that a sum, $$\sum_{k=1}^{n}\sum_{j=1}^{k} x_j,$$

has a value $+a$ and $-b$, respectively, over each said first and second code word; and
(ii) choosing one of the two possible code words for an information word of said group, so that the absolute value of said second running sum is minimized.

6. The method of claim 4 or 5 wherein a and b are equal.

7. A method of decoding a transmitted encoded information signal, comprising the steps of:
a. receiving the encoded information signal which comprises n-bit code words, where n is a positive integer, the n-bit code words being such that a first runnig sum, $$\sum_{j=1}^{i} x_j,$$

remains restricted over the bits of the n-bit code words regardless of the sequence of the information words, $x_j$ being a value of a $j^{th}$ bit and $x_j$ having a first value for a logic one and a second value opposite to said first value for a logic zero, the n-bit code words also being such that a second running sum, $$\sum_{k=1}^{i}\sum_{j=1}^{k} x_j,$$

remains restricted over the preceding sums over the bits of the generated code words, whereby the d.c. and low frequency content of the code words was reduced prior to transmission;

b. converting the n-bit code words into m-bit information words, where m is a positive integer less than n; and c. providing the m-bit information words as the information signal.

8. The method of claim 7 wherein the receiving step comprises receiving, for a first group of information words, code words for which:

$$\sum_{k=1}^{n}\sum_{j=1}^{k} x_j = 0$$

for every n-bit code word.

9. The method of claim 8 wherein the receiving step comprises receiving, for a second group of information words, first and second code words for which the sum, $$\sum_{k=1}^{n}\sum_{j=1}^{k} x_j,$$

has a value $+a$ and $-b$ respectively, over each said first and second code word, one of the first and second possible code words for each information word of said second group appearing in the encoded information so that the absolute value of said second running sum is minimized.

10. The method of claim 7 wherein the receiving step comprises, for each of a group of information words, first and second code words for which a sum, $$\sum_{k=1}^{n}\sum_{j=1}^{k} x_j,$$

has a value $+a$ and $-b$, respectively, over each said first and second code word, one of the first and second possible code words for an information word of said group appearing in the encoded information so that the absolute value of said second running sum is minimized.

11. The method of claim 9 or 10 wherein a and b are equal.

12. Apparatus for encoding an information signal prior to transmission, comprising:
a. means for receiving the information signal which comprises m-bit information words, where m is a positive integer;
b. means for converting the m-bit information words into n-bit code words so that a first running sum, $$\sum_{j=1}^{i} x_j,$$

remains restricted over the bits of the n-bit code words regardless of the sequence of information words, $x_j$ being a value of a $j^{th}$ bit and $x_j$ having a first value for a logic one and a second value opposite to said first value for a logic zero, where n is a positive integer and n>m;

c. means for providing an encoded information signal in the form of the n-bit code words;

wherein the improvement comprises that:

d. the converting means converts the m-bit information words into n-bit code words so that a second running sum $$\sum_{k=1}^{i} \sum_{j=1}^{k} x_j$$

remains restricted over the preceding sums over the bits of the n-bit code words whereby the low-frequency content of the encoded information signal is reduced.

13. The apparatus of claim 12 wherein:
 a. the receiving means comprises a series/parallel converter having parallel output means at which the m bits of the m-bit information words are provided in parallel;
 b. the converting means comprises a lookup table addressable by the m-bit information words and coupled to the output means of the series/parallel converter; and
 c. the providing means comprises a parallel/series converter coupled to an output of the converting means.

14. The Apparatus of claim 12 wherein:
 a. the receiving means comprises a series/parallel converter having a parallel output means at which the m bits of the m-bit information words are provided in parallel; and
 b. the converting means comprises a gating means having inputs coupled to the output means of the series/parallel converter; and
 c. the providing means comprises an output of the gating means.

15. Apparatus for receiving and decoding transmitted encoded information signals in which d.c. and low frequency components have been reduced, comprising:
 a. means for receiving the encoded information signals which comprise n-bit code words, where n is a positive integer, the n-bit code words being such that a first running sum $$\sum_{j=1}^{i} x_j$$

remains restricted over bits of said n-bit code words regardless of the sequence of information words encoded into said code words, $x_j$ being a value of a $j^{th}$ bit and $x_j$ having a first value for a logic one and a second value opposite to said first value for a logic zero;

b. means for converting the n-bit code words into m-bit information words, from which the n-bit code words were derived prior to transmission, there m is an integer less than n:

c. means for providing the m-bit information words as a decoded information signal;

wherein the improvement comprises:

d. the n-bit code words are such that a second running sum $$\sum_{k=1}^{i} \sum_{j=1}^{k} x_j$$

remains restricted over the preceding sums over the bits of the code words, whereby the d.c. and low frequency content of the code words has been further reduced.

16. The apparatus of claim 15 wherein:
 a. the receiving means comprises a series/parallel converter having a parallel output means at which the n bits of the n-bit code words are provided in parallel;
 b. the reconverting means comprises a lookup table addressable by the n-bit code words and coupled to the output means of the series/parallel converter; and
 c. the providing means comprises a parallel/series converter at an output of the reconverting means.

17. The apparatus of claim 15 wherein:
 a. the receiving means comprises a series/parallel converter having a parallel output means at which the n bits of the n-bit code words are provided in parallel;
 b. the reconverting means comprises gating means having inputs coupled to the output means of the series/parallel converter; and
 c. the providing means comprises an output of the gating means.

18. Apparatus for for encoding an information signal prior to transmission, comprising:
 a. an input for receiving the information signal which comprises information words;
 b. means for converting the information words into respective code words, the respective code words having a longer bit length than the corresponding information words and the respective code words being such that a first running sum, of values of the bits of the code words, remains restricted, regardless of the sequence of the information words, and so that a second running sum, of all preceding values of the first running sum, also remains restricted, regardless of the sequence of the information words; and
 c. means for providing an encoded information signal in the form of the code words, whereby the low frequency content of the encoded information signal is reduced.

* * * * *